United States Patent
Lim et al.

(10) Patent No.: US 9,534,568 B2
(45) Date of Patent: Jan. 3, 2017

(54) EXHAUST GAS RECIRCULATION VALVE FOR VEHICLE

(71) Applicants: Hyundai Motor Company, Seoul (KR); Kia Motors Corporation, Seoul (KR)

(72) Inventors: Jaepil Lim, Hwaseong-si (KR); Chan Seok Jeong, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 303 days.

(21) Appl. No.: 14/095,695

(22) Filed: Dec. 3, 2013

(65) Prior Publication Data

US 2014/0165975 A1  Jun. 19, 2014

(30) Foreign Application Priority Data

Dec. 17, 2012  (KR) .................. 10-2012-0147803

(51) Int. Cl.
*F02M 25/07* (2006.01)
*C23C 14/06* (2006.01)

(52) U.S. Cl.
CPC ............ *F02M 26/70* (2016.02); *F02M 26/74* (2016.02); *C23C 14/06* (2013.01); *Y02T 10/121* (2013.01)

(58) Field of Classification Search
USPC ..................................... 123/568.11
See application file for complete search history.

(56) References Cited

U.S. PATENT DOCUMENTS

| | | | | |
|---|---|---|---|---|
| 2,404,385 A * | 7/1946 | Morris Fritts | ......... | H01Q 13/24 279/158 |
| 5,873,611 A * | 2/1999 | Munley | ................... | F16L 23/10 24/20 W |
| 6,227,183 B1 * | 5/2001 | Miyoshi | ................. | F02M 26/12 123/568.23 |
| 6,279,552 B1 * | 8/2001 | Okada | ..................... | F16K 1/443 123/568.2 |
| 8,291,885 B2 | 10/2012 | Bornmann et al. | | |
| 9,181,847 B2 * | 11/2015 | Cha | ..................... | C23C 14/0641 |
| 2006/0213195 A1 * | 9/2006 | Leavesley | ............... | F02B 37/18 60/605.1 |
| 2008/0104950 A1 * | 5/2008 | Palanchon | .............. | F01N 1/166 60/324 |
| 2009/0123737 A1 * | 5/2009 | Yasui | ....................... | C23C 8/80 428/336 |
| 2010/0018204 A1 * | 1/2010 | McEwen | ............... | F02B 37/013 60/600 |

(Continued)

FOREIGN PATENT DOCUMENTS

| | | |
|---|---|---|
| JP | 2005-233023 A | 9/2005 |
| KR | 10-2011-0041265 A | 4/2011 |
| KR | 1020110041265 * | 4/2011 |

*Primary Examiner* — Stephen K Cronin
*Assistant Examiner* — Joshua A Campbell
(74) *Attorney, Agent, or Firm* — Morgan, Lewis & Bockius LLP

(57) ABSTRACT

An exhaust gas recirculation valve for a vehicle may include a housing having a flow path through which an exhaust gas flows, a shaft installed in the housing to be rotatable, a flap valve provided to be rotatable about the shaft and configured to open and close the flow path, a bushing provided on the shaft, an anti-wear washer installed on the shaft between the flap valve and the bushing, and a spring means installed on the shaft and configured to elastically support the bushing.

8 Claims, 3 Drawing Sheets

(56) References Cited

U.S. PATENT DOCUMENTS

| | | | |
|---|---|---|---|
| 2010/0044968 A1* | 2/2010 | Fischer | C23C 14/0641 277/443 |
| 2012/0293042 A1* | 11/2012 | Suzuki | H01L 41/1136 310/321 |
| 2012/0313739 A1* | 12/2012 | Chen | H01F 7/20 335/297 |
| 2014/0165975 A1* | 6/2014 | Lim | F02M 25/0793 123/568.11 |

* cited by examiner

EXHAUST GAS RECIRCULATION VALVE FOR VEHICLE

CROSS-REFERENCE TO RELATED APPLICATION

The present application claims priority of Korean Patent Application Number 10-2012-0147803 filed Dec. 17, 2012, the entire contents of which application are incorporated herein for all purposes by this reference.

BACKGROUND OF INVENTION

Field of Invention

The present invention relates to an exhaust gas recirculation valve for a vehicle, and more particularly, to an exhaust gas recirculation valve for a vehicle, capable of improving durability of the valve.

Description of Related Art

In general, a nitrogen oxide (NOx) is noxious gas that is produced by combining oxygen and nitrogen at a high pressure and temperature. In order to suppress the production of NOx, an exhaust gas recirculation (EGR) system is used to lower a maximum combustion temperature by supplying a part of exhaust gas discharged to the atmosphere back to an intake system, and reduce the production of NOx by reducing supply of oxygen.

In the EGR system, an amount of a part of exhaust gas, which is discharged to the atmosphere but supplied back to the intake system, influences a combustion state of fuel, and affects output of an engine, NOx contained in the exhaust gas, particulate matters (PM), and the like.

That is, the EGR system lowers a combustion temperature of the engine and reduces the production of NOx by recirculating a part of exhaust gas discharged from the engine back to an intake device of a cylinder.

As described above, an amount of exhaust gas, which returns, is important in the EGR system, and an EGR valve controls the returning exhaust gas.

Further, in order to control the recirculation of exhaust gas, a flap valve is installed in a recirculation flow path, and an opening degree of the flap valve is controlled by using a driving unit and a lever connected to the driving unit.

However, as a temperature of the recirculating exhaust gas is high, and opening and closing operations of the flap valve are repeatedly performed in accordance with operational states of the engine, repeated stresses are concentrated on components including the flap valve and the lever, and as a result, durability of the components may deteriorate.

That is, as illustrated in FIG. 1, in a case of a general EGR valve, there is a problem in that as a flap valve 12 is shifted in an upper direction due to abrasion of a contact surface between the flap valve 12 and a bushing 11, a portion A where the flap valve 12 and a housing 13 come into contact with each other is abraded.

Further, there is a problem in that the operation of the flap valve 12 fails because the flap valve 12 is trapped in the housing at the time of applying heat.

If stainless steel (SUS) is used as a material in order to solve the above-mentioned problem, hardness rapidly deteriorates at about 550° C. or more, and therefore it is disadvantageous when considering abrasion resistance. In addition, there is a problem in that it is difficult to manufacture the flap valve 12 and the bushing 11 with the same material when considering castability and weldability in terms of a manufacturing method.

The information disclosed in this Background section is only for enhancement of understanding of the general background of the invention and should not be taken as an acknowledgement or any form of suggestion that this information forms the prior art already known to a person skilled in the art.

SUMMARY OF INVENTION

The present invention has been made in an effort to provide an exhaust gas recirculation valve for a vehicle, capable of extending a service life span by improving durability of a flap valve.

Various aspects of the present invention provide an exhaust gas recirculation valve for a vehicle that may include a housing having a flow path through which an exhaust gas flows, a shaft installed in the housing to be rotatable, a flap valve provided to be rotatable about the shaft and configured to open and close the flow path, a bushing provided on the shaft, an anti-wear washer installed on the shaft between the flap valve and the bushing, and a spring means installed on the shaft and configured to elastically support the bushing.

The flap valve may include a flap cutting portion formed by cutting a part of an upper portion of the flap valve for fixing the anti-wear washer to the flap valve. A height of the flap cutting portion may be about 2.3 to 2.7 mm. A thickness of the anti-wear washer may be about 2.3 to 2.7 mm.

The anti-wear washer may have a washer cutting portion formed by cutting a part of both edges of the anti-wear washer for fixing the anti-wear washer to the flap cutting portion. The anti-wear washer may be made of a material comprising INCONEL 713C.

A material comprising TACSiCoN (TiAlCrSiCN) may be coated on a portion where the anti-wear washer and the bushing come into contact with each other. The bushing may be fixed to the housing by a key. The spring means may be made of a material comprising INCONEL X-750.

An upper bushing may be provided on the shaft between the spring and the bushing. The upper bushing may be made of stainless steel.

The methods and apparatuses of the present invention have other features and advantages which will be apparent from or are set forth in more detail in the accompanying drawings, which are incorporated herein, and the following Detailed Description, which together serve to explain certain principles of the present invention.

DETAILED DESCRIPTION

Figure 1:
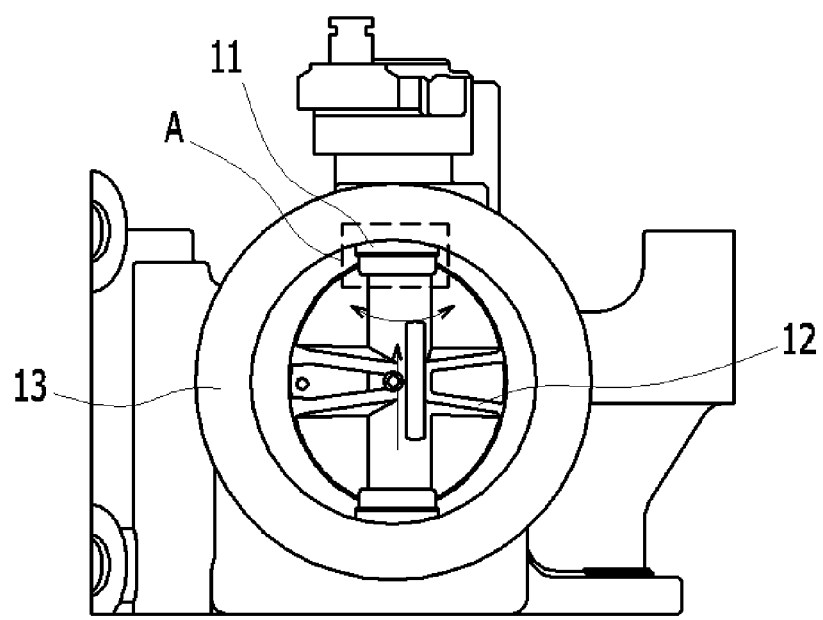
FIG. 1 is a view illustrating a configuration of a general exhaust gas recirculation valve for a vehicle.

Reference will now be made in detail to various embodiments of the present invention(s), examples of which are illustrated in the accompanying drawings and described below. While the invention(s) will be described in conjunction with exemplary embodiments, it will be understood that present description is not intended to limit the invention(s)

to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

The size and thickness of each configuration illustrated in the drawings are arbitrarily illustrated for explanatory convenience, but the present invention is not limited thereto, and the thicknesses are enlarged for apparently expressing various portions and regions.

In addition, in order to apparently explain exemplary embodiments of the present invention, a portion, which is not related to the description, is omitted, and like reference numerals designate like or similar constituent elements throughout the specification.

Figure 2:
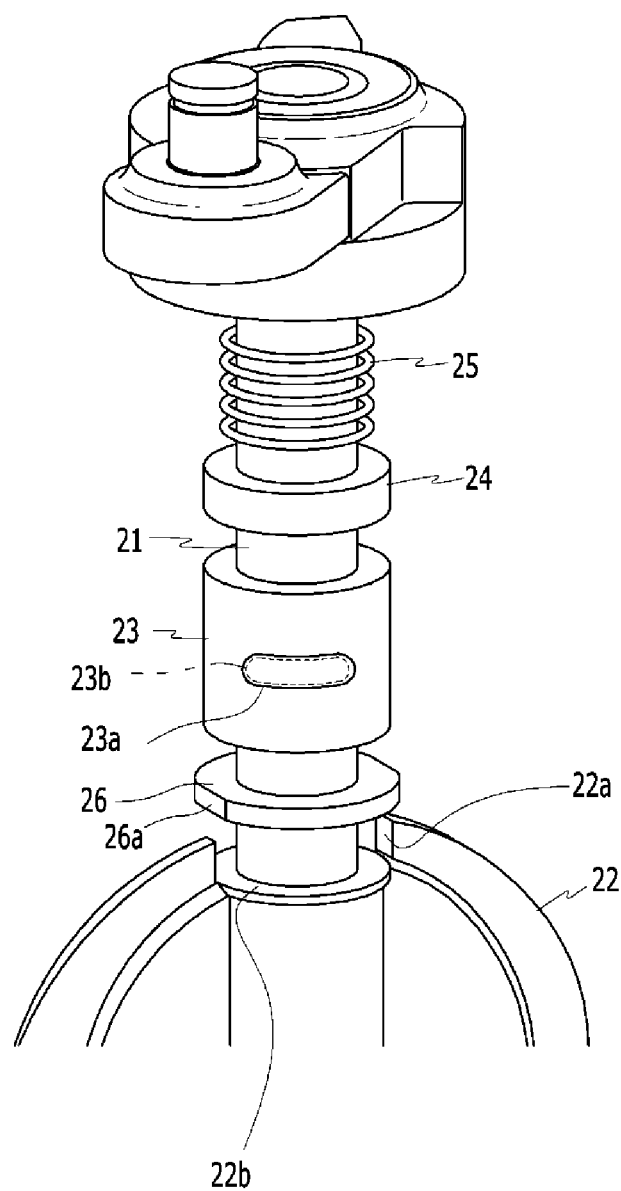
FIG. 2 is a perspective view illustrating an exemplary exhaust gas recirculation valve for a vehicle before it is fully assembled according to the present invention.
Figure 3:
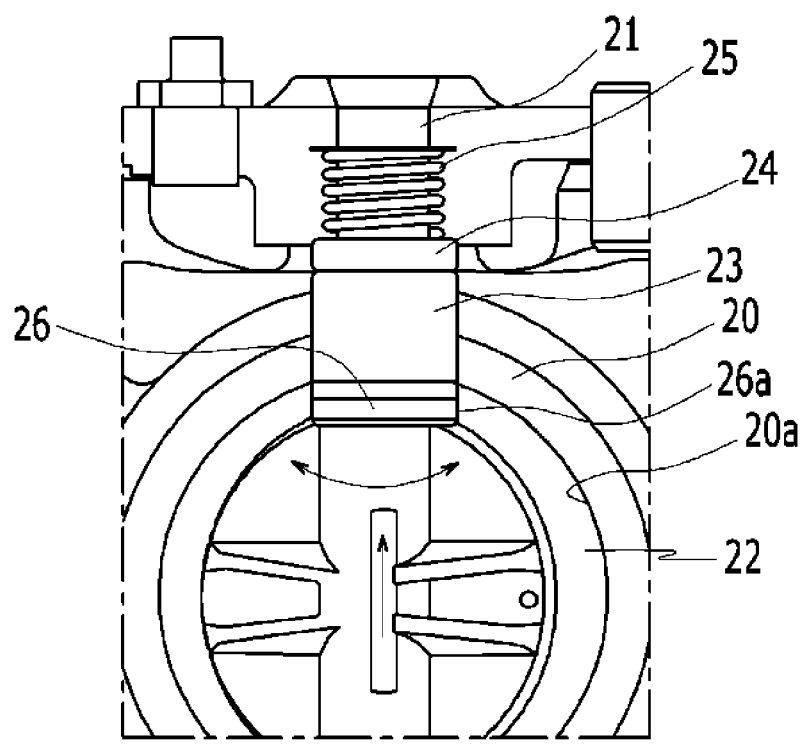
FIG. 3 is a view illustrating an exemplary fully assembled exhaust gas recirculation valve for a vehicle according to the present invention.

FIG. 2 is a perspective view illustrating an exhaust gas recirculation valve for a vehicle before it is fully assembled, and FIG. 3 is a view illustrating a fully assembled exhaust gas recirculation valve for a vehicle according to various embodiments of the present invention.

Referring to the drawings, an exhaust gas recirculation valve for a vehicle according to the present invention includes a housing 20 having a flow path 20a through which exhaust gas flows, a shaft 21 installed in the housing 20 to be rotatable, a flap valve 22 provided to be rotatable about the shaft 21 and configured to open and close the flow path 20a, a bushing 23 provided at the shaft 21, an anti-wear washer 26 installed on the shaft 21 between the flap valve 22 and the bushing 23, and a spring or spring means 25 installed on the shaft 21 so as to elastically support the bushing 23.

The flap valve 22 has a flap cutting portion 22a formed by cutting a part of an upper portion of the flap valve 22 so that the anti-wear washer 26 is fixed inside the flap valve 22.

Further, a height of the flap cutting portion 22a is about 2.3 to about 2.7 mm, and a thickness of the anti-wear washer 26 may also be about 2.3 to about 2.7 mm so as to correspond to the height of the flap cutting portion 22a. For example, if the thickness of the anti-wear washer 26 is about 2.5 mm, the height of the flap cutting portion 22a may be about 2.5 mm.

In addition, the anti-wear washer 26 has a washer cutting portion 26a formed by cutting a part of both edges of the anti-wear washer 26 so that the anti-wear washer 26 may be inserted in the flap cutting portion 22a. The reason is to make the anti-wear washer 26 be rotated together with the flap valve 22 when the flap valve 22 is rotated.

Further, the anti-wear washer 26 is made of INCONEL 713C or the like so as to maintain high temperature rigidity, even when the thickness thereof is about 2.5 mm.

In addition, a contact portion where the anti-wear washer 26 and the bushing 23 come into contact with each other when the anti-wear washer 26 and the bushing 23 are rotated as the flap valve 22 is rotated is coated with TACSiCoN (TiAlCrSiCN) or the like. The aforementioned TACSiCoN (TiAlCrSiCN) is an abrasion resistant, burning resistant, and reinforced coating material that is invented by the applicant of the present invention.

A key groove 23a is formed on an outer circumference of the bushing 23, and a key 23b is inserted into the key groove 23a such that the bushing 23 is fixed to the housing 20. Accordingly, a breakaway of the bushing 23 due to a difference in thermal expansion at a high temperature is prevented by a key mounting structure between the bushing 23 and the housing 20. In a case of a general exhaust gas recirculation valve, as the bushing 23 is installed by a pressing-in method, there is a problem in that the bushing 23 is moved away at a high temperature of about 700° C. or more.

In addition, the spring or spring means 25 is applied by INCONEL X-750 or the like, and therefore brittleness of the anti-wear washer 26 due to an up and down movement of the flap valve 22 is prevented. That is, an INCONEL material is applied in order to maintain elasticity of the spring or spring means 25 at a high temperature.

In a case of a general exhaust gas recirculation valve, because the spring or spring means 25 is made of stainless steel, elasticity thereof is lost during use.

Further, an upper bushing 24 is provided on the shaft 21 between the spring or spring means 25 and the bushing 23, and the upper bushing 24 is made of stainless steel (e.g., SUS 316).

An operation of the exhaust gas recirculation valve for a vehicle according to the present invention, which has the aforementioned configurations, will be described as follows. Here, only a characteristic operation of the exhaust gas recirculation valve for a vehicle according to the present invention will be described.

Referring to FIGS. 2 and 3, an engine control unit (ECU) rotates the shaft 21 in accordance with operational states of the engine to open and close the flap valve 22. Because operations and configurations of the ECU according to the operational states of the engine are known in the art, a detailed description will be omitted.

The exhaust gas recirculation valve for a vehicle according to the present invention is an EGR valve to which a manner of the flap valve 22, which can be used at a high temperature (750° C. or more), is applied, prevents abrasion of the flap valve (stainless steel material) 22, which generates friction while coming into contact with and being rotated with the bushing (high hardness sintered material) 23.

To this end, in order to maintain high temperature rigidity, the anti-wear washer 26 is made of INCONEL 713C or the like, and a high temperature abrasion resistant/burning resistant special coating (e.g., TiAlCrSiCN) is performed on the anti-wear washer 26. In addition, abrasion of the flap valve 22 is prevented by assembling the anti-wear washer 26 between the flap valve 22 including the flap cutting portion 22a for fixing the anti-wear washer 26 and the bushing 23 having the key groove 23a for preventing a breakaway.

In addition, robustness of the washer 26 having a thickness of about 2.5 mm is maintained by applying an INCONEL X750 material or the like, which maintains elasticity at a high temperature, to the spring or spring means 25, and absorbing vibration in up and down directions.

For convenience in explanation and accurate definition in the appended claims, the terms "upper" or "lower", and etc. are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. An exhaust gas recirculation valve for a vehicle, comprising:
    a housing having a flow path through which an exhaust gas flows;
    a shaft installed in the housing to be rotatable;
    a flap valve provided to be rotatable about the shaft and configured to open and close the flow path;
    a bushing provided on the shaft;
    an anti-wear washer installed on the shaft between the flap valve and the bushing wherein the anti-wear washer is fixed to the flap valve and rotates with the flap valve when the flap valve rotates; and
    a spring means installed on the shaft and configured to elastically support the bushing,
    wherein a material comprising TACSiCoN (TiAlCrSiCN) is coated on a portion where the anti-wear washer and the bushing come into contact with each other.

2. The exhaust gas recirculation valve of claim 1, wherein the flap valve includes a flap cutting portion formed by cutting a part of an upper portion of the flap valve for fixing the anti-wear washer to the flap valve.

3. The exhaust gas recirculation valve of claim 2, wherein a height of the flap cutting portion is about 2.3 to 2.7 mm.

4. The exhaust gas recirculation valve of claim 2, wherein a thickness of the anti-wear washer is about 2.3 to 2.7 mm.

5. The exhaust gas recirculation valve of claim 2, wherein the anti-wear washer includes a washer cutting portion formed by cutting a part of both edges of the anti-wear washer for fixing the anti-wear washer to the flap cutting portion.

6. The exhaust gas recirculation valve of claim 1, wherein the bushing is fixed to the housing by a key.

7. The exhaust gas recirculation valve of claim 1, wherein an upper bushing is provided on the shaft between the spring means and the bushing.

8. The exhaust gas recirculation valve of claim 7, wherein the upper bushing is made of stainless steel.

* * * * *